(12) United States Patent
Liu et al.

(10) Patent No.: US 11,917,868 B2
(45) Date of Patent: Feb. 27, 2024

(54) ORGANIC LIGHT EMITTING DIODE DISPLAY DEVICE AND METHOD OF MANUFACTURING THEREOF

(71) Applicant: WUHAN CHINA STAR OPTOELECTRONICS SEMICONDUCTOR DISPLAY TECHNOLOGY CO., LTD., Wuhan (CN)

(72) Inventors: Xuyang Liu, Wuhan (CN); Chao Liang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 343 days.

(21) Appl. No.: 17/263,139

(22) PCT Filed: Aug. 12, 2020

(86) PCT No.: PCT/CN2020/108681
§ 371 (c)(1),
(2) Date: Jan. 25, 2021

(87) PCT Pub. No.: WO2022/027716
PCT Pub. Date: Feb. 10, 2022

(65) Prior Publication Data
US 2022/0302233 A1 Sep. 22, 2022

(30) Foreign Application Priority Data
Aug. 6, 2020 (CN) .......................... 202010782373.4

(51) Int. Cl.
*H01L 51/52* (2006.01)
*H10K 59/124* (2023.01)
(Continued)

(52) U.S. Cl.
CPC ........... *H10K 59/124* (2023.02); *G06V 40/12* (2022.01); *G06V 40/1318* (2022.01);
(Continued)

(58) Field of Classification Search
CPC ............. H01L 27/1222–1233; H01L 27/1251; G06V 40/12; G06V 40/1318
See application file for complete search history.

(56) References Cited

U.S. PATENT DOCUMENTS

2009/0207365 A1\* 8/2009 Lee ................... G02F 1/136286
349/141
2009/0256831 A1\* 10/2009 Hsu .......................... G09G 3/20
345/211
(Continued)

FOREIGN PATENT DOCUMENTS

CN 103676382 A 3/2014
CN 104377247 A 2/2015
(Continued)

OTHER PUBLICATIONS

Machine translation, Zhuo, Chinese Pat. Pub. No. CN209843712U, translation date: Feb. 17, 2023, Espacenet, all pages. (Year: 2023).\*
(Continued)

*Primary Examiner* — Victoria K. Hall
(74) *Attorney, Agent, or Firm* — PV IP PC; Wei Te Chung; Zhigang Ma

(57) ABSTRACT

An organic light emitting diode (OLED) display device and a method of manufacturing thereof are provided. The organic light emitting diode display device includes a display area and a non-display area. The display area includes a pixel area and a photosensitive area disposed between the pixel areas. The photosensitive area includes a first thin film transistor. The pixel area includes a second thin film transistor, which the same type as the first thin film transistor.
(Continued)

The non-display area includes a third thin film transistor, which is a different type from the first thin film transistor.

7 Claims, 4 Drawing Sheets

(51) Int. Cl.

| | | |
|---|---|---|
| *G06V 40/13* | (2022.01) | |
| *H01L 27/12* | (2006.01) | |
| *H01L 29/417* | (2006.01) | |
| *G06V 40/12* | (2022.01) | |
| *H10K 59/40* | (2023.01) | |
| *H10K 59/65* | (2023.01) | |
| *H10K 59/126* | (2023.01) | |
| *H10K 71/00* | (2023.01) | |
| *H10K 59/60* | (2023.01) | |
| *H10K 59/12* | (2023.01) | |

(52) U.S. Cl.
CPC ...... *H01L 27/1222* (2013.01); *H01L 27/1225* (2013.01); *H01L 27/1251* (2013.01); *H01L 29/41733* (2013.01); *H10K 59/126* (2023.02); *H10K 59/40* (2023.02); *H10K 59/65* (2023.02); *H10K 71/00* (2023.02); *H10K 59/1201* (2023.02); *H10K 59/60* (2023.02)

(56) References Cited

U.S. PATENT DOCUMENTS

| | | | |
|---|---|---|---|
| 2014/0183476 A1* | 7/2014 | Kwon ............... | H01L 29/78633 257/43 |
| 2016/0155847 A1* | 6/2016 | Fang ................ | H01L 29/78633 257/43 |
| 2016/0274432 A1 | 9/2016 | Yao | |
| 2017/0068129 A1* | 3/2017 | Mochizuki ........ | G02F 1/133553 |
| 2017/0194416 A1 | 7/2017 | Chen et al. | |
| 2018/0083211 A1* | 3/2018 | Lee ...................... | H10K 59/124 |
| 2019/0172954 A1 | 6/2019 | Zhou et al. | |
| 2019/0181206 A1 | 6/2019 | Cao | |
| 2019/0392760 A1* | 12/2019 | Zeng .................... | G09G 3/3266 |
| 2020/0044093 A1 | 2/2020 | Liu et al. | |
| 2020/0185477 A1 | 6/2020 | Xia | |
| 2020/0194516 A1 | 6/2020 | Kim et al. | |
| 2020/0203445 A1 | 6/2020 | Ou et al. | |
| 2021/0028259 A1* | 1/2021 | Xu ....................... | H10K 59/1216 |
| 2021/0193819 A1* | 6/2021 | Ouyang ............... | H10K 59/122 |
| 2021/0375955 A1* | 12/2021 | Tian ..................... | H01L 27/1266 |

FOREIGN PATENT DOCUMENTS

| | | | | | |
|---|---|---|---|---|---|
| CN | 105742367 | A | * | 6/2016 | ......... H01L 29/0653 |
| CN | 105870059 | A | | 8/2016 | |
| CN | 105870059 | A | * | 8/2016 | ......... H01L 27/1225 |
| CN | 106022276 | A | | 10/2016 | |
| CN | 106022276 | A | * | 10/2016 | ............. G06F 18/00 |
| CN | 106601754 | A | * | 4/2017 | ......... H01L 27/1214 |
| CN | 106601754 | A | | 4/2017 | |
| CN | 106940488 | A | * | 7/2017 | ........... G02F 1/1333 |
| CN | 106940488 | A | | 7/2017 | |
| CN | 107025451 | A | | 8/2017 | |
| CN | 107086181 | A | | 8/2017 | |
| CN | 107706198 | A | | 2/2018 | |
| CN | 107870697 | A | * | 4/2018 | ........... G06F 3/0412 |
| CN | 107870697 | A | | 4/2018 | |
| CN | 107994055 | A | * | 5/2018 | ......... H10K 59/1201 |
| CN | 108110033 | A | | 6/2018 | |
| CN | 108110033 | A | * | 6/2018 | ............. H10K 59/12 |
| CN | 108538902 | A | | 9/2018 | |
| CN | 108873527 | A | | 11/2018 | |
| CN | 108873527 | A | * | 11/2018 | ....... G02F 1/136286 |
| CN | 110010626 | A | | 7/2019 | |
| CN | 110265457 | A | | 9/2019 | |
| CN | 110265457 | A | * | 9/2019 | ......... G06V 40/1306 |
| CN | 110349858 | A | * | 10/2019 | ....... H01L 29/66742 |
| CN | 110349858 | A | | 10/2019 | |
| CN | 209843712 | U | * | 12/2019 | ........... H01L 27/146 |
| CN | 110690227 | A | | 1/2020 | |
| CN | 110690227 | A | * | 1/2020 | ......... H01L 27/1214 |
| CN | 110707130 | A | | 1/2020 | |
| CN | 110718565 | A | * | 1/2020 | ......... G06V 40/1318 |
| CN | 110718565 | A | | 1/2020 | |
| CN | 110931522 | A | | 3/2020 | |
| CN | 111129091 | A | | 5/2020 | |
| CN | 111430441 | A | | 7/2020 | |
| CN | 111430441 | A | * | 7/2020 | ............. G06V 40/13 |
| JP | 2009198853 | A | * | 9/2009 | ............... G09F 9/30 |
| JP | 2009198853 | A | | 9/2009 | |

OTHER PUBLICATIONS

Machine translation, Bu, Chinese Pat. Pub. No. CN107994055A, translation date: Feb. 17, 2023, Espacenet, all pages. (Year: 2023).*
Machine translation, Cao, Chinese Pat. Pub. No. CN108110033A, translation date: Dec. 31, 2022, Espacenet, all pages. (Year: 2022).*
Machine translation, Gan, Chinese Pat. Pub. No. CN106601754A, translation date: Dec. 31, 2022, Espacenet, all pages. (Year: 2022).*
Machine translation, Wu, Chinese Pat. Pub. No. CN111430441A, translation date: Dec. 31, 2022, Espacenet, all pages. (Year: 2022).*
Machine translation, Xu, Chinese Pat. Pub. No. CN106022276A, translation date: Dec. 31, 2022, Espacenet, all pages. (Year: 2022).*
Machine translation, Yang, Chinese Pat. Pub. No. CN105870059A, translation date: Dec. 31, 2022, Espacenet, all pages. (Year: 2022).*
Machine translation, Ye, Chinese Pat. Pub. No. CN107870697A, translation date: Dec. 31, 2022, Espacenet, all pages. (Year: 2022).*
Machine translation, Zhang, Chinese Pat. Pub. No. CN106940488A, translation date: Dec. 31, 2022, Espacenet, all pages. (Year: 2022).*
Machine translation, Zhao, Chinese Pat. Pub. No. CN110265457A, translation date: Dec. 31, 2022, Espacenet, all pages. (Year: 2022).*
Machine translation, Song, Chinese Pat. Pub. No. CN110690227A, translation date: Dec. 31, 2022, Espacenet, all pages. (Year: 2022).*
Machine translation, Matsumoto, Japanese Pat. Pub. No. JP2009198853A, translation date: Dec. 31, 2022, Espacenet, all pages. (Year: 2022).*
Machine translation, Xiao, Chinese Pat. Pub. No. CN110718565A, translation date: Dec. 31, 2022, Espacenet, all pages. (Year: 2022).*
Machine translation, You, Chinese Pat. Pub. No. CN108873527A, translation date: Dec. 31, 2022, Espacenet, all pages. (Year: 2022).*
Machine translation, Zhang, Chinese Pat. Pub. No. CN110349858A, translation date: Dec. 31, 2022, Espacenet, all pages. (Year: 2022).*
International Searching Authority, Translation, Written Opinion of the International Searching Authority, International application No. PCT/CN2020/108681, dated Apr. 9, 2021, all pages. (Year: 2021).*
International Searching Authority, Translation, International Search Report, International application No. PCT/CN2020/108681, dated Apr. 9, 2021, all pages. (Year: 2021).*
Machine translation, Fang, Chinese Pat. Pub. No. CN105742367A, translation date: Jun. 21, 2023, Clarivate Analytics, all pages. (Year: 2023).*
International Search Report in International application No. PCT/CN2020/108681, dated Apr. 9, 2021.
Written Opinion of the International Search Authority in International application No. PCT/CN2020/108681, dated Apr. 9, 2021.
Chinese Office Action issued in corresponding Chinese Patent Application No. 202010782373.4 dated May 27, 2022, pp. 1-11.

* cited by examiner

ORGANIC LIGHT EMITTING DIODE DISPLAY DEVICE AND METHOD OF MANUFACTURING THEREOF

This application is a National Phase of PCT Patent Application No. PCT/CN2020/108681 having international filing date of Aug. 12, 2020, which claims the benefit of priority of Chinese Patent Application No. 202010782373.4 filed on Aug. 6, 2020. The contents of the above applications are all incorporated by reference as if fully set forth herein in their entirety.

BACKGROUND OF INVENTION

Field of Invention

The present invention relates to a field of display technology, and more particularly, to an organic light emitting diode device and a method of manufacturing thereof.

Description of Prior Art

Organic light emitting display (OLED) devices have a self-luminescence property and do not need a backlight module. Furthermore, the OLED devices have high contrast, thin thickness, wide viewing angles, and fast response time properties, and they may be used for flexible panels. Also, the devices may work in a wide operating temperature range, and have simple structures and relatively simple manufacturing processes. Therefore, the devices are considered as emerging application technologies for the next generation of flat panel displays.

Fingerprint recognition technology serves as a kind of biometric technology, and has characteristics of universality, uniqueness, security and collectability. With rise of full-screen technology, fingerprint recognition has gradually evolved from outside to inside of the display. That is, under-screen fingerprint recognition technology, so as to achieve a higher screen-to-body ratio. Currently, under-screen fingerprint unlocking method includes three type, such as capacitive touch, optical touch, and ultrasonic touch, and the optical touch is mainly adopted.

Take the optical fingerprint unlocking as an example, the principle is that optical sensor recognizes the difference in the reflected light intensity between the ridge and valley of the fingerprint to obtain the fingerprint appearance. The fingerprint sensor is disposed under the OLED panel. Currently, most fingerprint unlocking modules of mobile phones are limited to a specific area, which affects user experience.

Therefore, it is necessary to provide an OLED display device and a method of manufacturing thereof to solve problems in the prior art.

SUMMARY OF INVENTION

Currently, fingerprint unlocking modules in the organic light emitting diode (OLED) display device and a method of manufacturing thereof are limited to a specific area, which affects user's experience.

An organic light emitting diode (OLED) display device comprises:
an OLED display panel comprising a display area, a non-display area disposed at a periphery of the display area, and a gate on array (GOA) wiring area disposed at both ends of an edge of the non-display area. The display area comprises a pixel area and a photosensitive area disposed between pixel areas. The photosensitive area comprises a fingerprint recognition module, and the fingerprint recognition module comprises a first thin film transistor. The pixel area comprises an OLED light emitting unit, and the OLED light emitting unit comprises a second thin film transistor. The GOA wiring area comprises a GOA circuit, and the GOA circuit comprises a third thin film transistor. The first thin film transistor and the second thin film transistor are same type of transistors, and the third thin film transistor and the first thin film transistor are different types of transistors.

In one embodiment, the first thin film transistor, the second thin film transistor, and the third thin film transistor comprise a flexible substrate, a barrier layer, and a buffer layer stacked from bottom to top.

In one embodiment, both the first thin film transistor and the second thin film transistor are provided with a first gate insulating layer on the buffer layer, and the third thin film transistor is provided with a second active layer and the first gate insulating layer on the buffer layer, the first gate insulating layer completely covers the second active layer. A material of the second active layer comprises a high-mobility material, and the high-mobility material comprises poly-silicon.

In one embodiment, the first thin film transistor, the second thin film transistor, and the third thin film transistor are each provided with a first gate and a second gate insulating layer on the first gate insulating layer, the second gate insulating layer completely covers the first gate, and the first gate of the third thin film transistor is disposed on the second active layer.

In one embodiment, both the first thin film transistor and the second thin film transistor are provided with a first active layer on the second gate insulating layer, and the first active layer is correspondingly disposed on the first gate. The third thin film transistor is provided with a second gate on the second gate insulating layer, and the second gate is correspondingly disposed on the first gate. The first active layer is made of a low-leakage current material, and the low-leakage current material comprises indium gallium zinc oxide or amorphous silicon.

In one embodiment, the first thin film transistor, the second thin film transistor, and the third thin film transistor are each provided with an interlayer insulating layer and a source-drain metal layer on the second gate insulating layer. The interlayer metal layer completely covers the first active layer and the second gate, and the source-drain metal layer is connected to the first active layer and the second active layer through via holes.

In one embodiment, the second thin film transistor is further provided with a light-shielding layer on the interlayer insulating layer, the light-shielding layer is correspondingly disposed on the first active layer, and the light-shielding layer is made of a triple layer of titanium, aluminum, and titanium.

In one embodiment, the first thin film transistor is further provided with a planarization layer on the interlayer insulating layer, and the planarization layer completely covers the source-drain metal layer. The second thin film transistor is further provided with the planarization layer, an anode metal layer, and a pixel definition layer on the interlayer insulating layer. The third thin film transistor is further provided with the planarization layer and the pixel definition layer on the interlayer insulating layer.

A method of manufacturing above-mentioned OLED display device comprises steps of following:

S10, depositing a barrier layer and a buffer layer on a flexible substrate in order, and forming a second active layer on the buffer layer;

S20, forming a first gate insulating layer on the buffer layer, the first gate insulating layer completely covering the second active layer, and forming a first gate on the first gate insulating layer;

S30, forming a second gate insulating layer on the first gate insulating layer, the second gate insulating layer completely covering the first gate, and forming a second gate and a first active layer on the second gate insulating layer;

S40, forming an interlayer insulating layer on the second gate insulating layer, the interlayer insulating layer completely covering the second gate and the first active layer, and forming a first via hole, a second via hole, and a third via hole on the interlayer insulating layer;

S50, forming a source-drain metal layer and a light-shielding layer on the interlayer insulating layer, and the light-shielding layer is directly disposed directly above a part of the first active layer; and S60, forming a planarization layer on the interlayer insulating layer, the planarization layer completely covering the source-drain metal layer and the light-shielding layer, forming a fourth via hole on the planarization layer, and forming an anode metal layer and a pixel definition layer on the planarization layer in order.

In one embodiment, the first active layer is made of a low-leakage current material, and the low leakage current material comprises indium gallium zinc oxide or amorphous silicon material, and the second active layer comprises a high-mobility material, and the high-mobility material comprises polysilicon.

In one embodiment, in the S10, the flexible substrate is a single-layer polyimide film or a double-layer polyimide film, and the barrier layer and the buffer layer are inorganic films composed of silicon nitride or silicon oxide.

In one embodiment, the first gate insulating layer and the second gate insulating layer are inorganic films composed of silicon nitride or silicon oxide, and the first gate and the second gate are made of copper-molybdenum alloy.

In one embodiment, in the S40, the interlayer insulating layer is an inorganic film composed of silicon nitride or silicon oxide.

In one embodiment, in the S40, the third via hole exposes both ends of an edge of the second active layer, the first via hole exposes both ends of an edge of the first active layer in a photosensitive area, and the second via hole exposes a part of both ends of an edge of the first active layer of non-photosensitive area in a display area.

In one embodiment, the source-drain metal layer is connected to both ends of an edge of the second active layer through the third via. The source-drain metal layer connected to both ends of an edge of the first active layer through the first via hole and the second via hole. The light-shielding layer is directly disposed above a part of the first active layer of the non-photosensitive area in the display area.

In one embodiment, the light-shielding layer and the source-drain metal layer are made of a triple layer of titanium, aluminum, and titanium.

Accordingly, the OLED display device and a method of manufacturing thereof according to the embodiments of the present invention integrate the fingerprint recognition sensor into the OLED screen array, which increases the unlocking area of the screen and further reduces the manufacturing cost of the OLED display device.

DETAILED DESCRIPTION OF PREFERRED EMBODIMENTS

Figure 1:
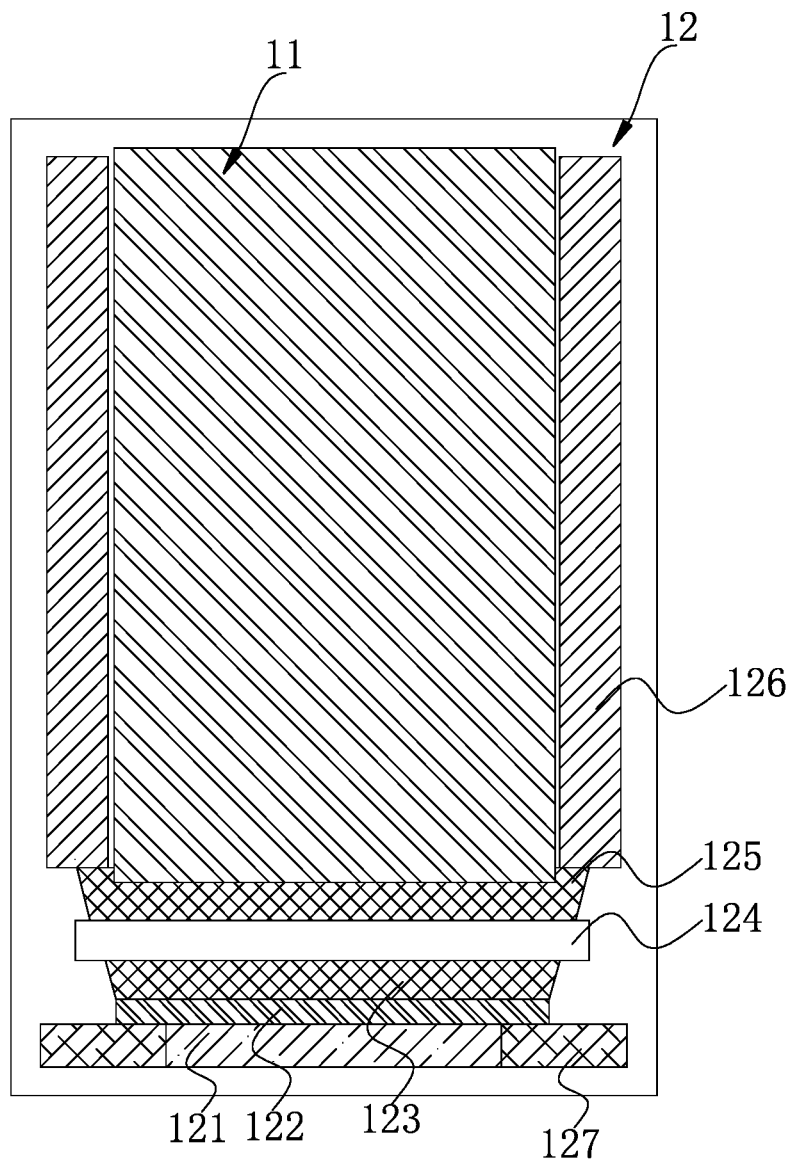
FIG. 1 is a schematic plan view of an organic light emitting diode (OLED) display device according to one embodiment of the present invention.

The embodiment of the present invention addresses the technical problem that the fingerprint recognition module in an organic light emitting diode (OLED) display device of the prior art and a method of manufacturing thereof are limited to a specific area, which affects user's experience. This embodiment can solve the problems. As shown in FIG. 1, it is a schematic plan view of an OLED display device according to one embodiment of the present invention. Each component of the embodiment of the present invention and the relative positional relationship between each component can be seen very intuitively in the drawings.

The OLED display device comprises an OLED display panel. The OLED display panel comprises a display area 11 and a non-display area 12 disposed at a periphery of the display area 11. The non-display area 12 also comprises a bonding area 121, a first fan-out wiring area 123, a bending area 124, and a second fan-out wiring area 125. The bending area 124 is disposed between the first fan-out wiring area 123 and the second fan-out wiring area 125. The first fan-out wiring area 123 and the second fan-out wiring area 125 are provided with a plurality of fan-out data lines. The bonding area 121 is provided with an integrated circuit chip and a plurality of pads, and the fan-out data lines are connected to the pads through the bonding area 121.

Specifically, a bonding test area 122 is further disposed between the bonding area 121 and the first fan-out wiring area 123, and a bonding test circuit is disposed in the bonding test area 122, and the bonding test circuit is configured to detect whether the fan-out data line passing through the binding area 121 is abnormal or not.

Furthermore, a gate on array (GOA) wiring area 126 is disposed in the non-display area 12 close to the two ends of the edge of the display area 11, and the GOA wiring area 126 is configured to provide scanning signals of pixels in the display area 11.

Furthermore, a cell test pad 27 is disposed on both ends of the edge of the bonding area 121, and the cell test pad is configured to perform a cell test of the OLED display panel.

Figure 2:
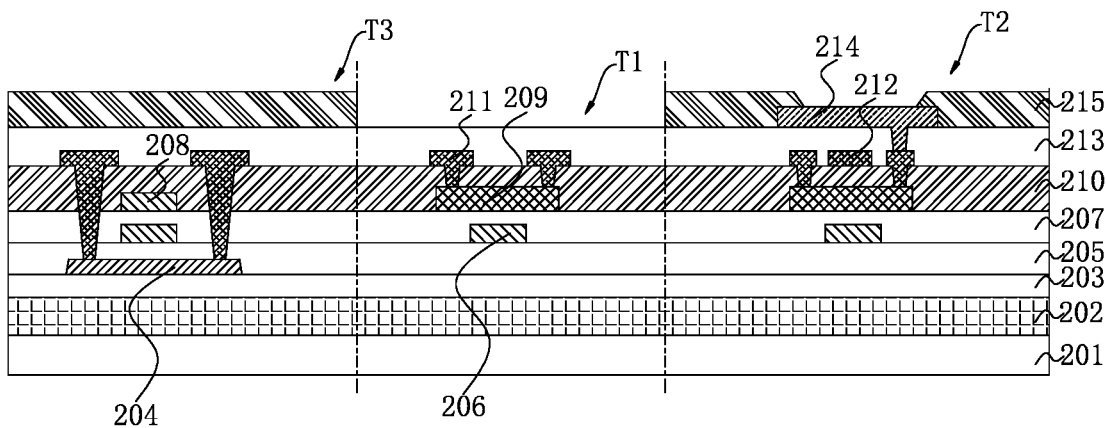
FIG. 2 is a schematic view of an array structure of the OLED display device according to one embodiment of the present invention.

Furthermore, the display area comprises a pixel area and a photosensitive area disposed between the pixel areas, the photosensitive structure area comprises a fingerprint recognition module, and the fingerprint recognition module is configured to collect the light signal emitted by the OLED light-emitting unit reflected by the ridge and valley of the fingerprint, so as to convert the light signal into an electrical signal for output. As shown in FIG. 2, it is a schematic view of an array structure of the OLED display device according to one embodiment of the present invention. The fingerprint recognition module comprises a first thin film transistor (T1), and the first thin film transistor (T1) is configured to provide a scan signal of the fingerprint recognition module.

The fingerprint recognition module comprises a first thin film transistor (T1). The pixel area comprises an OLED light emitting unit. The OLED light emitting unit comprises a second thin film transistor (T2). The GOA wiring area comprises a GOA circuit. The GOA circuit comprises a third thin film transistor (T3). The first thin film transistor (T1) and the second thin film transistor (T2) are the same type of transistors. The third thin film transistor (T3) and the first thin film transistor (T1) are different types of transistors. Specifically, the first thin film transistor (T1) is a bottom-gate thin film transistor. The first thin film transistor (T1) comprises a flexible substrate 201, a barrier layer 202, a buffer layer 203, a first gate insulating layer 205, a first gate 206, a second gate insulating layer 207 disposed on the first gate insulating layer 205 and covering the first gate 206, a first active layer 209, an interlayer insulating layer 210 disposed on the second gate insulating layer 207 and covering the first active layer 209, a source-drain metal layer 211, and a planarization layer 213 stacked from bottom to top.

Furthermore, the fingerprint recognition module adopts an optical fingerprint unlocking method. When a finger touches any position on the mobile phone screen, the area of the OLED lights up. The light source illuminates the ridges and valleys of the fingerprint of the finger, so as to reflect different light intensities to the first thin film transistor (T1). The first thin film transistor (T1) generates different induced currents due to illumination, thereby obtaining fingerprint ridge and valley position information.

Preferably, the driving current of the fingerprint recognition module is driven by 1T1C (one thin film transistor and one capacitor), 2T1C (two thin film transistors and one capacitor), and 2T2C (two thin film transistors and two capacitors).

Preferably, the first active layer 209 is made of a low-leakage current material, and the low-leakage current material comprises indium gallium zinc oxide (IGZO) or amorphous silicon material (a-Si).

Specifically, a part of display area excluding non-photosensitive area is provided with the OLED light emitting unit. The OLED light emitting unit comprises a second thin film transistor (T2), and the second thin film transistor (T2) is configured to drive pixels in the OLED display device to emit light.

Furthermore, the second thin film transistor (T2) comprises the flexible substrate 201, the barrier layer 202, the buffer layer 203, the first gate insulating layer 205, and the first gate 206, the second gate insulating layer 207, the first active layer 209, the interlayer insulating layer 210, a light-shielding layer 212 disposed on the interlayer insulating layer 210 and directly above the first active layer 209, the source-drain metal layer 211, the planarization layer 213, an anode metal layer 214, and a pixel definition layer 215 stacked from bottom to top.

Preferably, the light-shielding layer 212 and the source-drain metal layer 211 are made of a triple layer of titanium, aluminum, and titanium (Ti/Al/Ti), and the light-shielding layer 212 is configured to prevent current generated during light from affecting the second thin film transistor (T2).

Preferably, a thickness of the first thin film transistor (T1) and the second thin film transistor (T2) ranges from 500 angstroms to 15000 angstroms.

Specifically, the GOA wiring area adopts low temperature polysilicon (LTPS) structural backplate technology. The GOA wiring area comprises a third thin film transistor (T3). The third thin film transistor (T3) comprises the flexible substrate 201, the barrier layer 202, the buffer layer 203, a second active layer 204 disposed on the buffer layer 203, the first gate insulating layer 205, the first gate 206, the second gate insulating layer 207, the second gate 208 disposed on the second gate insulating layer 207, the interlayer insulating layer 210, the source-drain metal layer 211, the planarization layer 213, and the pixel definition layer 215 stacked from bottom to top.

Furthermore, the second active layer 204 comprises a high-mobility material, and the high-mobility material comprises polysilicon.

Preferably, the flexible substrate 201 is a single-layer polyimide film or a double-layer polyimide film, and the barrier layer 202 and the buffer layer 203 are inorganic films composed of silicon nitride or silicon oxide.

Preferably, the first gate insulating layer 205 and the second gate insulating layer 207 are inorganic films composed of silicon nitride or silicon oxide, and the first gate 206 and the second gate 208 is made of copper-molybdenum alloy.

Preferably, the planarization layer 213 and the pixel definition layer 215 are made of organic photoresist.

The OLED display device according to the embodiments of the present invention is characterized by embedding fingerprint recognition and photosensitive thin film transistors into the display area, so that it can realize comprehensive screen recognition.

Figure 3:
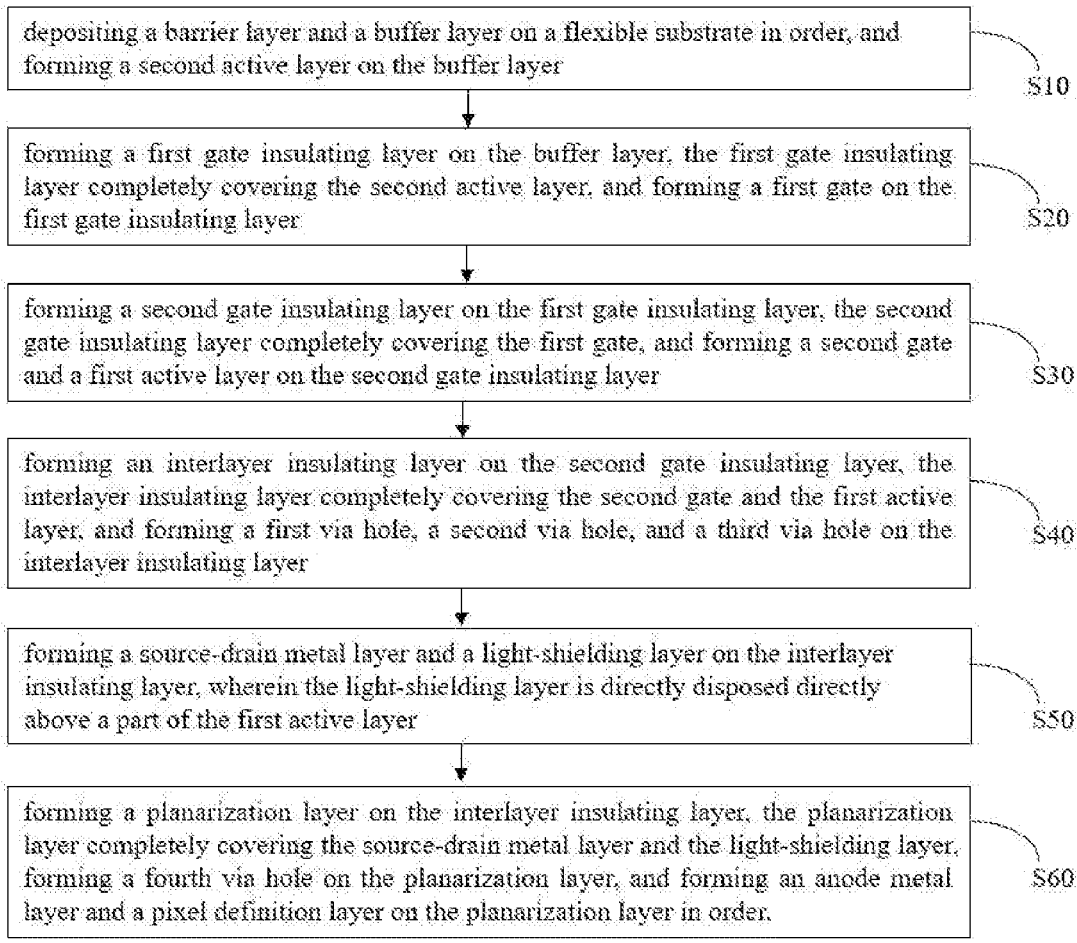
FIG. 3 is a flowchart of a method of manufacturing the OLED display device according to one embodiment of the present invention.

As shown in FIG. 3, it is a flowchart of a method of manufacturing the OLED display device according to one embodiment of the present invention. The method comprises steps of following:

S10, depositing a barrier layer and a buffer layer on a flexible substrate 201 in order, and forming a second active layer 204 on the buffer layer 203.

Figure 4A:
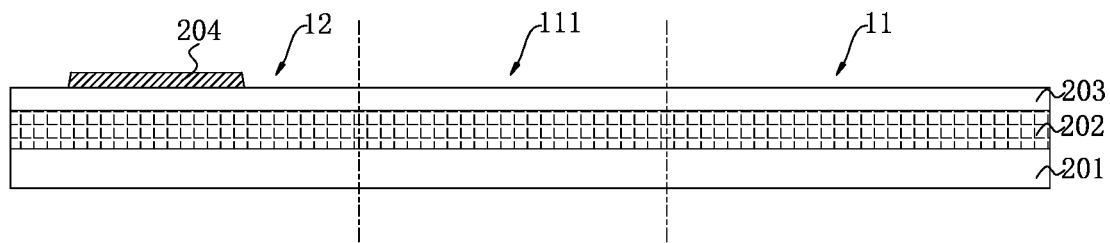
FIG. 4A to FIG. 4F are schematic structural views of a method of manufacturing the OLED display device according to one embodiment of the present invention.

Specifically, the S10 further comprises steps as follows. First, a flexible substrate 201 is provided. The flexible substrate comprises a display area 11 and a GOA wiring area 12. A photosensitive area 111 is also disposed in the display area 11. After that, a barrier layer 202 and a buffer layer 203 are successively deposited on the flexible substrate 201 to serve as buffer and protection, and then a semiconductor layer is deposited on a part of the buffer layer 203 disposed in the GOA wiring area 12, and using excimer laser crystallization technology to achieve polysiliconization of the semiconductor layer, and using photoresist (PR) and a mask to pattern the semiconductor layer, and finally obtain the second active layer 204. Preferably, the flexible substrate 201 is a single-layer polyimide film or a double-layer polyimide film, and the barrier layer 202 and the buffer layer 203 are inorganic films composed of silicon nitride or silicon oxide. The second active layer 204 comprises a high-mobility material, and the high-mobility material comprises a poly-silicon as shown in FIG. 4A.

S20, forming a first gate insulating layer 205 on the buffer layer 203, the first gate insulating layer 205 completely covering the second active layer 204, and forming a first gate 206 on the first gate insulating layer 205.

Figure 4B:
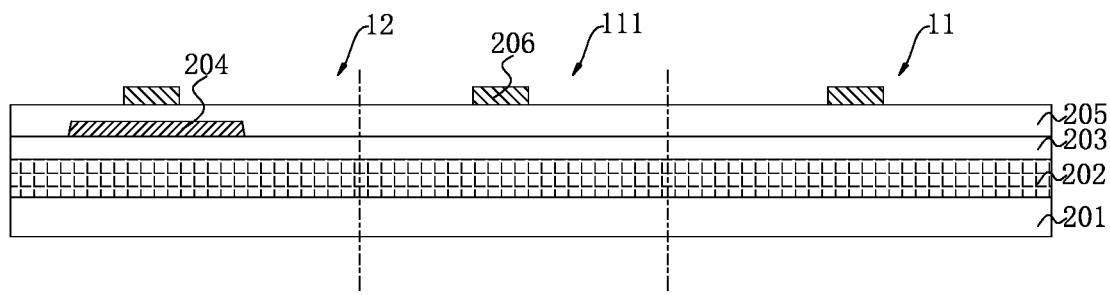

Specifically, the S20 further comprises steps as follows. First, a first gate insulating layer 205 and a first gate 206 are deposited on the buffer layer 203 in order, and using photoresist (PR) and a mask for patterning. The first gate insulating layer 205 completely covers the second active layer 204. After that, the second active layer 204 is heavily doped by an ion implantation process (IMP) by using a self-aligned process. Preferably, as shown in FIG. 4B, the first gate insulating layer 205 is an inorganic film composed of silicon nitride or silicon oxide, and the first gate 206 is made of copper-molybdenum alloy.

S30, forming a second gate insulating layer 207 on the first gate insulating layer 205, the second gate insulating layer 207 completely covering the first gate 206, and forming a second gate 208 and a first active layer 209 on the second gate insulating layer 207.

Figure 4C:
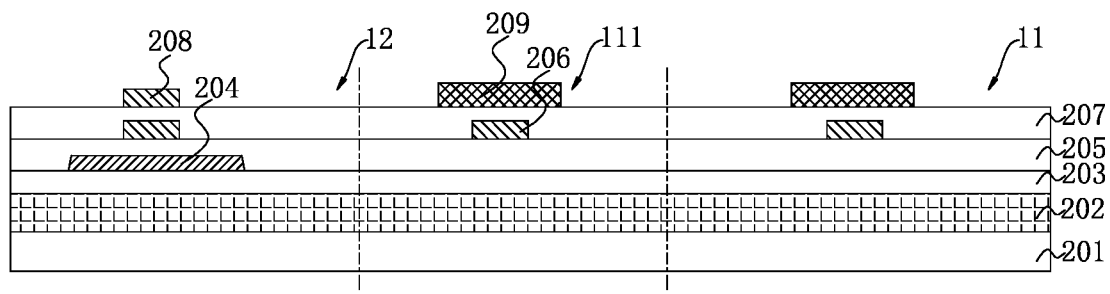

Specifically, the S30 further comprises steps as follows. A second gate insulating layer 207 is formed on the first gate insulating layer 205, and is patterned by using a photoresist (PR) and a mask. The second gate insulating layer 207 completely covers the first gate 206. After that, a second gate 208 is formed on the second gate insulating layer 207 in a part of the GOA wiring area 12, and a photoresist (PR) and a mask (mask) are used for patterning the second gate 208. Finally, a first active layer 209 is formed on a part of the second gate insulating layer 207 in the display area 11, and a photoresist (PR) and a mask are used for patterning the first active layer 209. Preferably, the second gate insulating layer 207 is an inorganic film layer composed of silicon nitride or silicon oxide, and the second gate 208 is made of copper-molybdenum alloy. Preferably, the first active layer 209 is made of low-leakage current material, and the low-leakage current material comprises indium gallium zinc oxide (IGZO) or amorphous silicon material (a-Si), as shown in FIG. 4C.

S40, forming an interlayer insulating layer 210 on the second gate insulating layer 207, the interlayer insulating layer 210 completely covering the second gate 208 and the first active layer 209, and forming a first via hole 2101, a second via hole 2102, and a third via hole 2103 on the interlayer insulating layer 210.

Figure 4D:
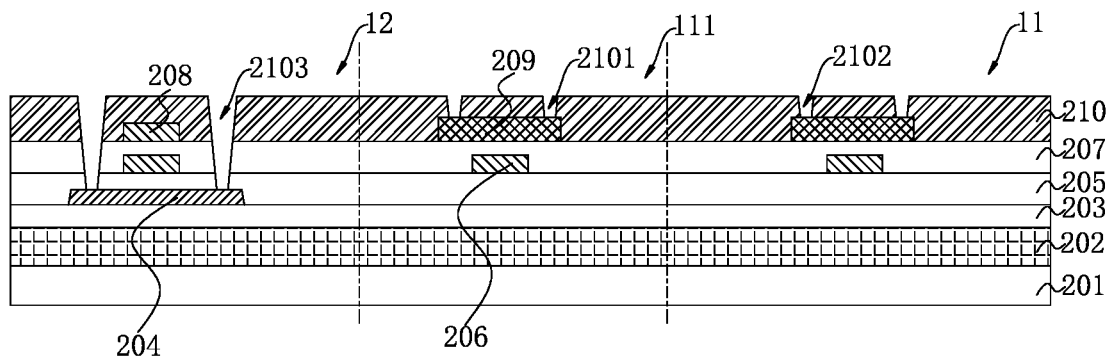

Specifically, the S40 further comprises steps as follows. First, an interlayer insulating layer 210 is formed on the second gate insulating layer 207, and the interlayer insulating layer 210 completely covers the second gate 208 and the first active layer 209. Then, a first via hole 2101, a second via hole 2102, and a third via hole 2103 are respectively formed on the interlayer insulating layer 210. The third via hole 2103 exposes both ends of the edge of the second active layer 204. The first via hole 2101 exposes both ends of the edge of the first active layer 209 in the photosensitive area 111. The second via hole 2102 exposes a part of both ends of the edge of the first active layer 209 of non-photosensitive area 12. Preferably, the interlayer insulating layer is an inorganic film composed of silicon nitride or silicon oxide, as shown in FIG. 4D.

S50, forming a source-drain metal layer 211 and a light-shielding layer 212 on the interlayer insulating layer 210. The light-shielding layer 212 is directly disposed above a part of the first active layer 209 in the display area 11.

Specifically, the S50 further comprises steps as follows. A source-drain metal layer 211 and a light-shielding layer 212 are formed on the interlayer insulating layer 210, and the source-drain metal layer 211 is connected to both ends of the edge of the second active layer 204 through the third via hole 2103. The source-drain metal layer 211 is also connected to both ends of the edge of the first active layer 209 through the first via hole 2101 and the second via hole 2102. The light-shielding layer 212 is directly disposed above a part of the first active layer 209 of the non-photosensitive area 12.

Figure 4E:
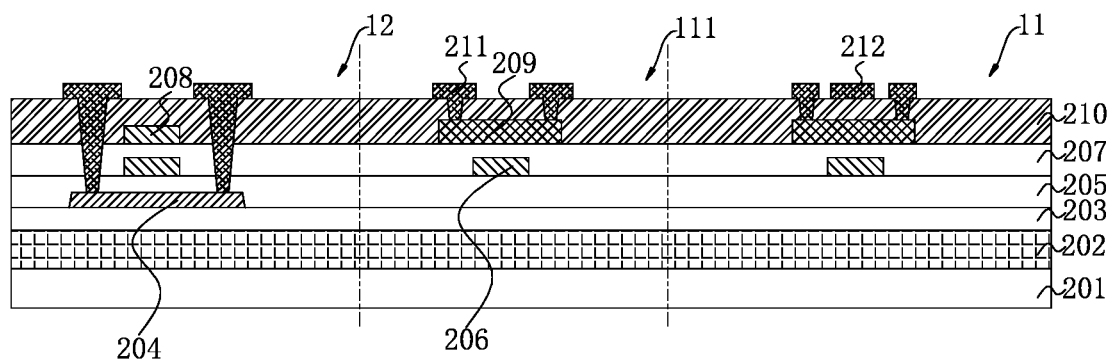

Preferably, the light-shielding layer 212 and the source-drain metal layer 211 are made of a triple layer of titanium, aluminum, and titanium (Ti/Al/Ti), and the light-shielding layer 212 is configured to prevent current generated during light from affecting the thin film transistors in the photosensitive area 111, as shown in FIG. 4E.

S60, forming a planarization layer 213 on the interlayer insulating layer 210, the planarization layer 213 completely covering the source-drain metal layer 211 and the light-shielding layer 212, forming a fourth via hole on the planarization layer 213, and forming an anode metal layer 214 and a pixel definition layer 215 on the planarization layer 213 in order.

Figure 4F:
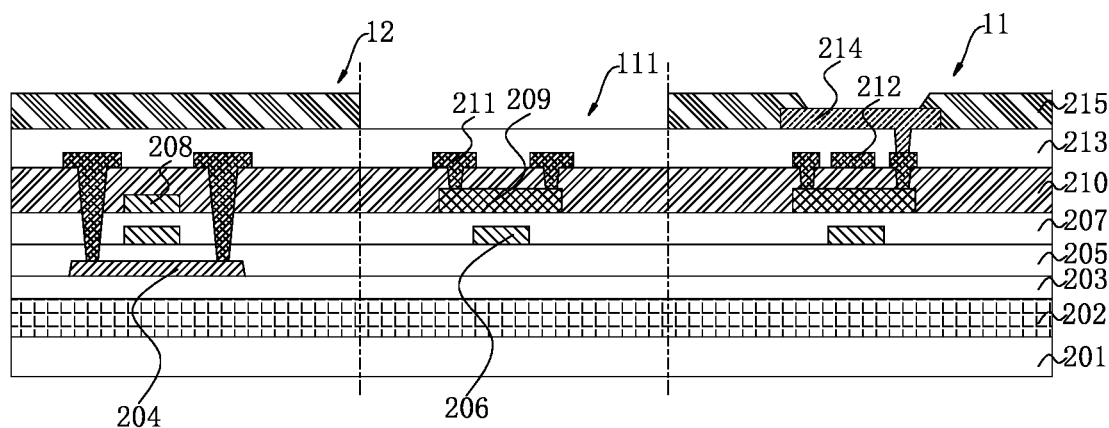

Specifically, the S60 further comprises steps as follows. First, an organic photoresist is coated on the interlayer insulating layer 210 by a photolithography process to form a planarization layer 213, and a fourth via hole is formed on the planarization layer 213, and the fourth via hole is formed in the non-photosensitive area 12. Then, a metal layer is deposited on the planarization layer 213 to form an anode metal layer 214, and the anode metal layer 214 is connected to one end of the first active layer 209 through the fourth via hole. Finally, an organic photoresist is coated on the interlayer insulating layer 210 by a photolithography process to form a pixel definition layer 215, and the pixel definition layer 215 is disposed in the GOA wiring area 12 and the non-photosensitive area 12, as shown in FIG. 4F.

For the specific implementation of the above operations, please refer to the previous embodiments, which will not be described herein.

Accordingly, the OLED display device and a method of manufacturing thereof according to the embodiments of the present invention integrate the fingerprint recognition sensor into the OLED screen array, which increases the unlocking area of the screen and further reduces the manufacturing cost of the OLED display device.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:
1. A method of manufacturing an organic light emitting diode (OLED) display device, comprising steps of following:
   S10, depositing a barrier layer and a buffer layer on a flexible substrate in order, and forming a second active layer on the buffer layer;
   S20, forming a first gate insulating layer on the buffer layer, the first gate insulating layer completely covering the second active layer, and forming a first gate on the first gate insulating layer;
   S30, forming a second gate insulating layer on the first gate insulating layer, the second gate insulating layer completely covering the first gate, and forming a second gate and a first active layer on the second gate insulating layer;
   S40, forming an interlayer insulating layer on the second gate insulating layer, the interlayer insulating layer completely covering the second gate and the first active layer, and forming a first via hole, a second via hole, and a third via hole in the interlayer insulating layer;
   S50, forming a source-drain metal layer and a light-shielding layer on the interlayer insulating layer, wherein the light-shielding layer is disposed directly above a part of the first active layer of a non-photosensitive area; and S60, forming a planarization layer on the interlayer insulating layer, the planarization layer completely covering the source-drain metal layer and the light-shielding layer, forming a fourth via hole on the planarization layer, and forming an anode metal layer and a pixel definition layer on the planarization layer in order;

wherein in the S40, the third via hole exposes both ends of an edge of the second active layer, the first via hole exposes both ends of an edge of the first active layer in a photosensitive area, and the second via hole exposes a part of both ends of an edge of the first active layer in the non-photosensitive area of a display area.

2. The method of manufacturing the OLED display device according to claim 1, wherein the first active layer is made of a low-leakage current material, and the low leakage current material comprises indium gallium zinc oxide or amorphous silicon material; and wherein the second active layer comprises a high-mobility material, and the high-mobility material comprises polysilicon.

3. The method of manufacturing the OLED display device according to claim 1, wherein in the S10, the flexible substrate is a single-layer polyimide film or a double-layer polyimide film, and the barrier layer and the buffer layer are inorganic films composed of silicon nitride or silicon oxide.

4. The method of manufacturing the OLED display device according to claim 1, wherein the first gate insulating layer and the second gate insulating layer are inorganic films composed of silicon nitride or silicon oxide, and the first gate and the second gate are made of copper-molybdenum alloy.

5. The method of manufacturing the OLED display device according to claim 1, wherein in the S40, the interlayer insulating layer is an inorganic film composed of silicon nitride or silicon oxide.

6. The method of manufacturing the OLED display device according to claim 1, wherein the source-drain metal layer is connected to both ends of the edge of the second active layer through the third via; and wherein the source-drain metal layer is connected to both ends of the edge of the first active layer through the first via hole in the photosensitive area, and the source-drain metal layer is connected to the part of both ends of the first active layer in the non-photosensitive area through the second via hole.

7. The method of manufacturing the OLED display device according to claim 6, wherein the light-shielding layer and the source-drain metal layer are made of a triple layer of titanium, aluminum, and titanium.

* * * * *